(12) United States Patent
Sobel et al.

(10) Patent No.: US 6,621,071 B2
(45) Date of Patent: Sep. 16, 2003

(54) MICROELECTRONIC SYSTEM WITH INTEGRAL CRYOCOOLER, AND ITS FABRICATION AND USE

(75) Inventors: Larry D. Sobel, Tucson, AZ (US); Jeff Capara, Tucson, AZ (US)

(73) Assignee: Raytheon Co., Lexington, MA (US)

( * ) Notice: Subject to any disclaimer, the term of this patent is extended or adjusted under 35 U.S.C. 154(b) by 0 days.

(21) Appl. No.: 09/952,513

(22) Filed: Sep. 7, 2001

(65) Prior Publication Data

US 2003/0047685 A1 Mar. 13, 2003

(51) Int. Cl.[7] .................................................. H01J 7/24
(52) U.S. Cl. .................... 250/238; 250/214 R; 257/716; 257/721
(58) Field of Search ............................. 250/238, 214 K, 250/370.15; 62/259.2, 264; 257/714, 716, 721

(56) References Cited

U.S. PATENT DOCUMENTS

| 4,386,505 A | | 6/1983 | Little ........................... 62/51.1 |
|---|---|---|---|
| 4,392,362 A | | 7/1983 | Little ........................... 66/193 |
| 4,489,570 A | | 12/1984 | Little ........................... 62/51.1 |
| 4,682,032 A | * | 7/1987 | Barrett ......................... 250/352 |
| 4,747,450 A | * | 5/1988 | Ikegame et al. ............. 165/168 |
| 5,590,538 A | * | 1/1997 | Hsu et al. .................... 62/51.2 |
| 5,596,228 A | * | 1/1997 | Anderton et al. ........... 257/712 |
| 6,054,676 A | * | 4/2000 | Wall et al. ................... 219/209 |
| 6,127,203 A | * | 10/2000 | Wan et al. ................... 438/106 |
| 6,252,221 B1 | * | 6/2001 | Kaneko et al. ....... 250/214 LS |
| 2001/0021847 A1 | * | 9/2001 | Abboud et al. ............... 606/21 |

* cited by examiner

Primary Examiner—David Porta
Assistant Examiner—Stephen Yam

(57) ABSTRACT

A microelectronic system includes a substrate that is preferably silicon and a microelectronic device supported on the substrate. The microelectronic device may be a light sensor that include a readout integrated circuit formed in the silicon substrate, and a light detector supported on and electrically interconnected with the readout integrated circuit. A cryocooler formed in and integral with the substrate includes a gas inflow channel formed in the substrate, an expansion nozzle formed in the substrate and receiving a gas flow from the gas inflow channel, and a gas outflow channel that receives the gas flow from the outlet of the expansion nozzle. The gas inflow channel and the gas outflow channel may be countercurrent spirals.

22 Claims, 3 Drawing Sheets

MICROELECTRONIC SYSTEM WITH INTEGRAL CRYOCOOLER, AND ITS FABRICATION AND USE

This invention relates to cooled microelectronic systems and, more particularly, to a sensor system with an integral cryocooler that rapidly cools the sensor when placed into service.

BACKGROUND OF THE INVENTION

In one type of imaging infrared sensor system, a microelectronic light sensor is deposited on a substrate. The substrate is supported on a cold-finger pedestal. Another end of the pedestal is cooled by a cooler such as a Joule-Thompson cooler. The light sensor achieves its most efficient operation and highest signal-to-noise ratio when cooled to a cryogenic temperature such as liquid nitrogen temperature or lower. The light sensor and the cold-finger pedestal are placed inside a vacuum enclosure which has a window facing the light sensor and through which light is admitted. The vacuum enclosure insulates the light sensor and cold-finger pedestal, and protects the light sensor.

When the sensor system is to be operated, the cooler is activated to cool the cold-finger pedestal and thence the light sensor to cryogenic temperature. Upon reaching the cryogenic operating temperature, the light sensor is activated. The output signal of the light sensor is provided to a display or to a computer for further processing.

Microelectronic sensor systems of this type are well known and widely used. One of their drawbacks, however, is that the time required to cool the light sensor from ambient temperature to its cryogenic operating temperature may be on the order of one minute. For some applications that cooldown time may be acceptable, but for other applications, such as military applications, it may be unacceptably long. Additionally, the light sensor is cantilever mounted on the end of the cold-finger pedestal, increasing the susceptibility of the signals to degradation due to vibration. There is also the desire to decrease the size and weight of the sensor system as much as possible.

Various techniques have been employed to increase the cooldown rate and to reduce the size and weight of the sensor system. However, there remains a need for an improved approach to cryogenically cooled sensor systems that overcomes the shortcomings while still providing the required low operating temperature and satisfactory performance of the light sensor.

This cooling problem has been posed in relation to sensors, but it is equally applicable to some other types of microelectronic systems that generate large amounts of heat during service, such as high-performance computer chips and microelectronic amplifiers. It may not be necessary to cool these microelectronic systems to cryogenic temperatures, but accelerated heat removal may be required to maintain the microelectronic systems within operating temperature limits.

Thus, there is a need for an improved approach to cooling a variety of microelectronic systems, some to cryogenic temperatures. The present invention fulfills this need, and further provides related advantages.

SUMMARY OF THE INVENTION

The present invention provides a microelectronic system in which heat is rapidly removed and the components of the microelectronic system are cooled. The cooling may be to a cryogenic temperature. The cooler is integral with the microelectronic system rather than being separate from it as in conventional cold-finger pedestal designs. There is a shorter path from the microelectronic system to the cold sink and fewer interfaces than in conventional coolers (and in some cases no interfaces), with less thermal impedance as a result. The microelectronic system is therefore cooled from a higher temperature to its service temperature, which may be a cryogenic service temperature, more rapidly than in conventional designs. The size and weight of the microelectronic system are reduced. In the case where the microelectronic system is a sensor system, performance of the sensor system is improved because the light sensor is not cantilevered at the end of an arm, so that there is less susceptibility to vibration.

In accordance with the invention, a sensor system comprises a substrate, a microelectronic device such as a light sensor or other chip supported on the substrate, and a cryocooler formed in and integral with the substrate.

In a preferred approach, the substrate is made of silicon. A microelectronic device is formed in the silicon substrate or other type of substrate material. The microelectronic device may generally be of any type. In one example, the microelectronic device may be a chip such as a silicon-based microcircuit (e.g., a microprocessor chip) or an amplifier chip for a computer or other application. In another example of interest, the microelectronic device in the form of a light sensor comprises a readout integrated circuit formed in and integral with the substrate, and a light detector supported on and electrically interconnected with the readout integrated circuit. The cryocooler is a Joule-Thomson cryocooler.

The cryocooler preferably comprises a gas inflow channel in the substrate, an expansion nozzle in the substrate, a nozzle inlet that receives a gas flow from the gas inflow channel, a nozzle outlet, and a gas outflow channel in the substrate that receives the gas flow from the nozzle outlet. There may additionally be an expansion volume in fluid communication with the nozzle outlet, so that the gas outflow channel is in fluid communication with the nozzle outlet through the expansion volume. The gas outflow channel is preferably countercurrent to the gas inflow channel. The gas inflow channel and the gas outflow channel may each be a spiral in plan view, or they may be of other shapes such as straight, curved but not spiral, serpentine, and the like. The substrate may have multiple layers. For example, the substrate may comprise a first layer and a second layer, with the gas inflow channel and the gas outflow channel in the first layer, the expansion volume in the second layer, and the microelectronic device integral with the second layer. The substrate may comprise three layers, with the gas inflow channel in the first layer, the gas outflow channel in the second layer, the expansion volume in the third layer, and the microelectronic device integral with the third layer. Other multilayer structures are possible. In the case where the light sensor includes the readout integrated circuit and the light detector, the readout integrated circuit is formed in the substrate, and the light detector is supported on the readout integrated circuit.

A method for cooling a microelectronic system comprises the steps of fabricating a microelectronic system by furnishing a substrate having a front side and a back side, depositing a microelectronic device onto the front side of the substrate, and microforming a cryocooler within the substrate between the microelectronic device and the back side of the substrate, or on the back side of the substrate. The method further includes introducing a pressurized gas into the cryocooler to generate cooling of the substrate and the microelectronic device readout integrated circuit, and operating the microelectronic device. The above-described embodiments may be used in conjunction with the method, and the features of the method may be used in conjunction with the above-described embodiments.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
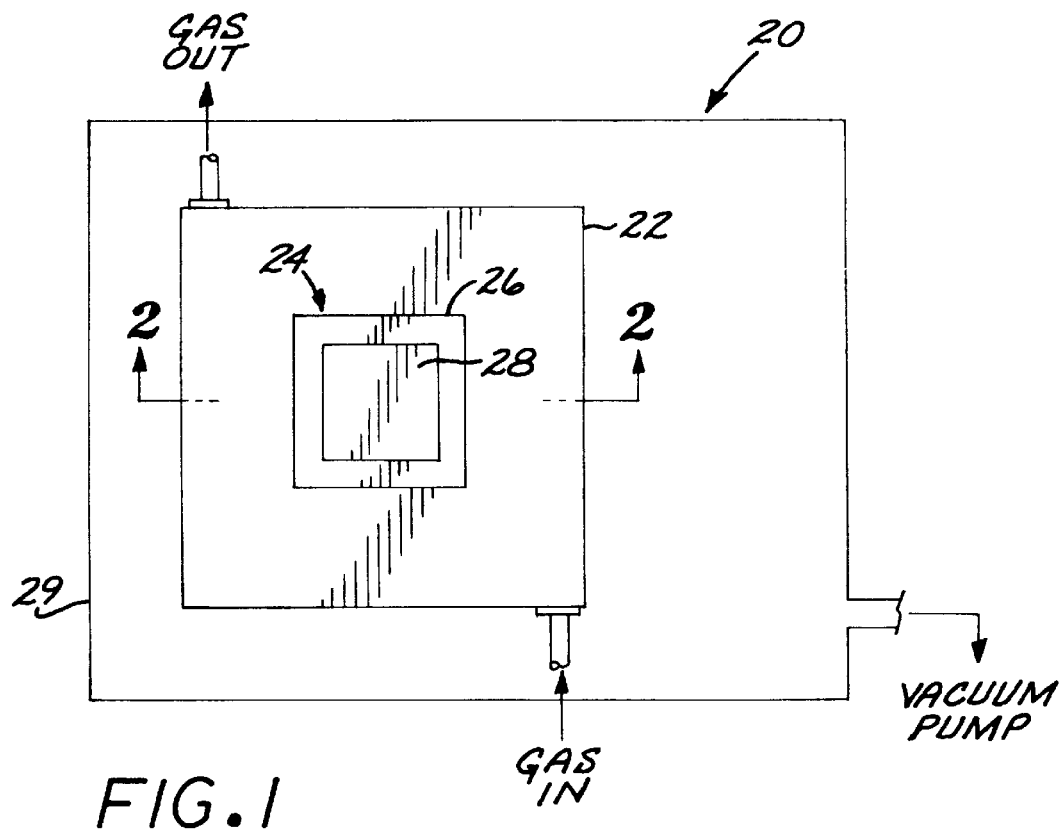
FIG. 1 is a plan view of a microelectronic system.

FIG. 1 depicts a microelectronic system 20. In the illustrated preferred embodiment of most interest to the inventors, the microelectronic system 20 is a sensor system that senses light. The following discussion will focus on this light sensor application, but it is equally applicable to other types of microelectronic systems in which other types of microelectronic devices are used instead of the light sensor, such as computer chips, power converters, amplifiers, other non-optical microcircuits, and other heat-producing or cooled microelectronic devices. In the preferred applications, such as a light sensor, the microelectronic device is cooled to a cryogenic temperature such as liquid nitrogen temperature or below. Where the microelectronic system includes other types of microelectronic devices, it may not be necessary to cool the microelectronic device to cryogenic temperature, but instead to some intermediate service temperature within the operating temperature limits of the components of the microelectronic device.

The microelectronic system 20 includes a substrate 22 with a microelectronic device 24, here in the form of a light sensor, supported on the substrate 22. The light-sensor microelectronic device 24 includes a readout integrated circuit (ROIC) 26 deposited onto the substrate 22. The ROIC 26 is typically formed of a silicon-based technology, and the substrate 22 is therefore preferably a chip of silicon. In other applications, the substrate 22 may be made of other materials such as other semiconductor substrates, ceramics (e.g., aluminum oxide), or metals (e.g., beryllium or aluminum). The microelectronic device 24 further includes a light detector 28 that is mechanically supported on and is electrically interconnected with the ROIC 26. The light detector 28 is typically formed of a technology other than silicon, such as gallium arsenide. The light detector 28 may be fabricated to be sensitive to any selected wavelength or wavelength range of light, such as the ultraviolet, visible, near infrared, mid infrared, or far infrared. The light detector 28 is preferably joined to the ROIC 26 by a bump structure. Microelectronic devices 24 in the form of light sensors and their fabrication for the various wavelengths of light are known in the art. The microelectronic system 20 may include a vacuum enclosure 29 that evacuates the environment around the enclosed components 22–28. The operation in a vacuum reduces thermal losses and protects the light sensor. In other applications, no vacuum enclosure is employed.

Figure 2:
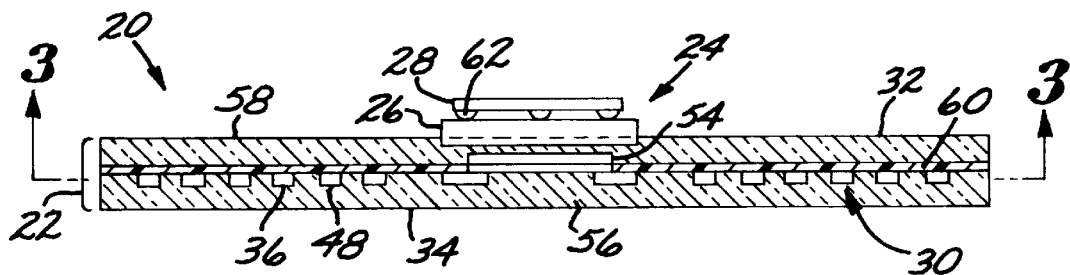
FIG. 2 is an enlarged schematic sectional view of the sensor system of FIG. 1, taken along line 2—2 of FIG. 1.
Figure 3:
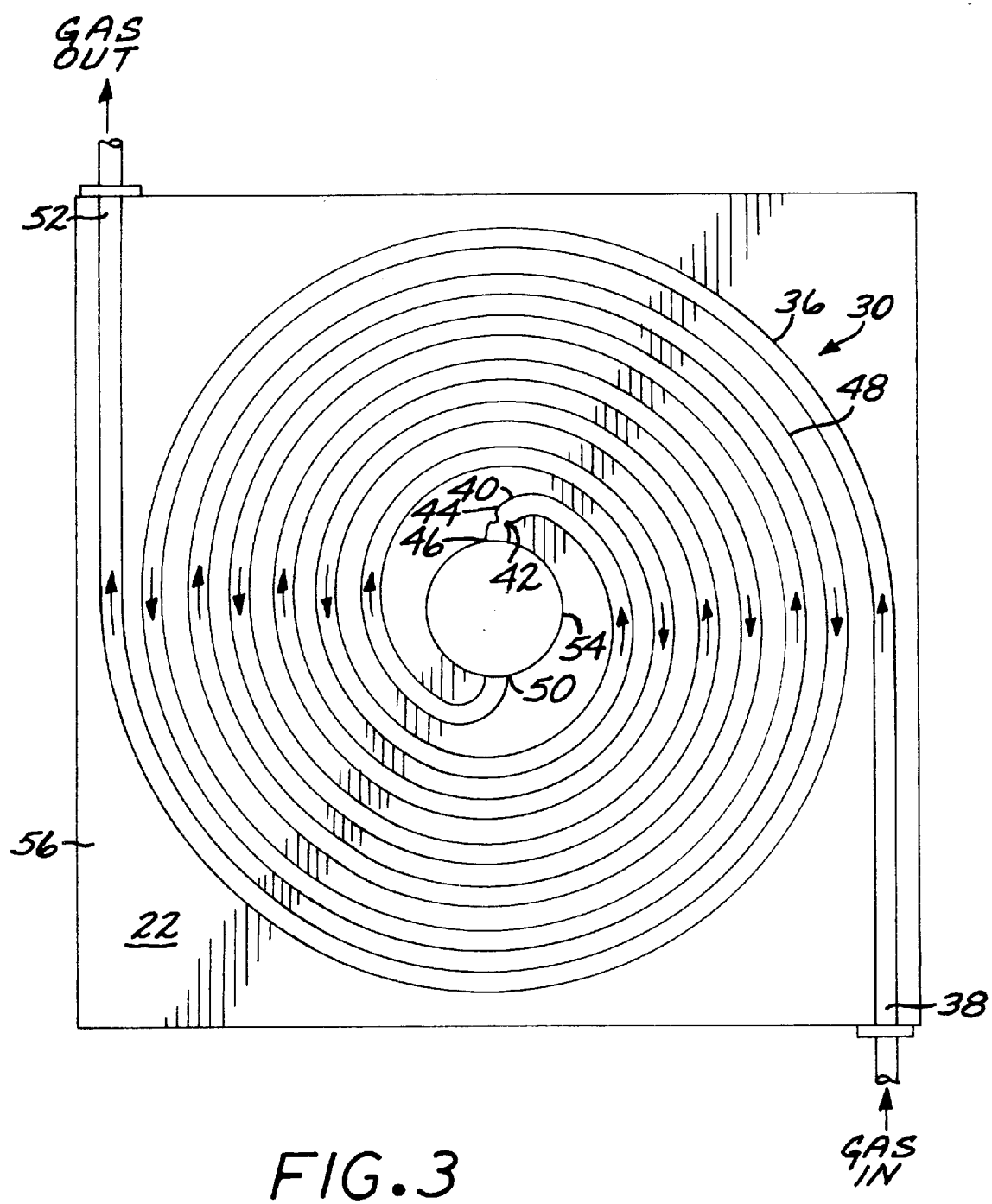
FIG. 3 is an enlarged schematic sectional view of the sensor system of FIGS. 1 and 2, taken along line 3—3 of FIG. 2.

FIGS. 2 and 3 depict a cryocooler 30 formed in and integral with the substrate 22. The substrate 22 has a front side 32 and a back side 34. The microelectronic device 24 is supported on, and usually deposited upon, the front side 32 of the substrate 22. The cryocooler 30 is integral with the substrate 22, meaning that it lies between the microelectronic device 24 and the front side 32 of the substrate 22, on the one hand, and the back side 34 of the substrate 22, on the other hand.

The cryocooler 30 of FIGS. 2–3 comprises a gas inflow channel 36 formed in the substrate 22. The gas inflow channel 36 has an inlet end 38 in gaseous communication with a source of pressurized working gas (not shown) and an outlet end 40. An expansion nozzle 42 is formed in the substrate 22 as a constriction in the gas flow path. The expansion nozzle 42 has a nozzle inlet 44 in fluid communication with the outlet end 40 of the gas inflow channel 36, and a nozzle outlet 46. A gas outflow channel 48 is formed in the substrate 22. The gas outflow channel 48 has an inlet end 50 in fluid communication with the nozzle outlet 46, and an outlet end 52 through which working gas escapes from the microelectronic system 20. In the preferred embodiment that is illustrated, an expansion volume 54 is in fluid communication between the nozzle outlet 46 and the inlet end 50 of the gas outflow channel 48. The inlet end 50 of the gas outflow channel 48 is therefore in fluid communication with the nozzle outlet 46 through the expansion volume 54. The cryocooler 30 is preferably a miniature Joule-Thompson expansion-cycle cryostat, with pressurized working gas expanding through the expansion nozzle 42, liquefying, and then subsequently vaporizing to absorb heat. The vaporized working gas is conducted away through the gas outflow channel 48.

In the illustrated embodiment, the gas inflow channel 36 and the gas outflow channel 48 are each planar when viewed in the sectional elevational view of FIG. 2 and are each spiral when viewed in the sectional plan view of FIG. 3. The present approach is not limited to a spiral configuration. The gas inflow channel 36 and the gas outflow channel 48 may each be of other shapes as well in the plan view, such as straight, curved but not spiral, serpentine, prismatic, and the like, according to the requirements for the removal of heat. In the preferred approach, each turn of the gas inflow channel 36 is directly laterally adjacent to the corresponding turn of the gas outflow channel 48. The channels 36 and 48 are thus arranged so that the working gas flows in the adjacent channels 36 and 48 are countercurrent to each other. The outward flow of working gas in the gas outflow channel 48 thus serves to precool the inward flow of working gas in the gas inflow channel 36.

The channels and volumes of the cryocooler 30 may be dimensioned as desired. In a typical case that is presented as illustrative but not limiting, the substrate 22 is about 0.050 inch thick, the channels 36 and 48 are each about 0.005 inch wide and about 0.015 inch high, the channels 36 and 48 are spaced apart from each other by about 0.005 inches, and the expansion volume 54 is a circular disk with a diameter of about 0.450 inch and a height of about 0.025 inch. The expansion nozzle 42 is preferably in the form of a constriction in the gas inflow channel 36 having dimensions of a minimum width of about 0.002 inch and a height of about 0.015 inch.

In one embodiment as illustrated in FIG. 2, the substrate 22 comprises a first layer 56 and a second layer 58. In this design, the gas inflow channel 36, the expansion nozzle 42, and the gas outflow channel 48 are in the first layer 56. The expansion volume 54 is in the second layer 58 directly under and adjacent to the microelectronic device 24, and the microelectronic device 24 is integral with the second layer 58. This configuration facilitates the fabrication of the microelectronic system 20 and also positions the coldest portion of the cryocooler 30, the expansion volume 54, close to the microelectronic device 24. An insulation layer 60 such as a layer of vapor deposited titanium may optionally be positioned between the first layer 56 and the second layer 58, except in the location of the expansion volume 54. This insulation layer 60 may be deposited on the underside of the second layer 58 so that it lies between the layers 56 and 58 after the layers 56 and 58 are assembled together.

Figure 4:
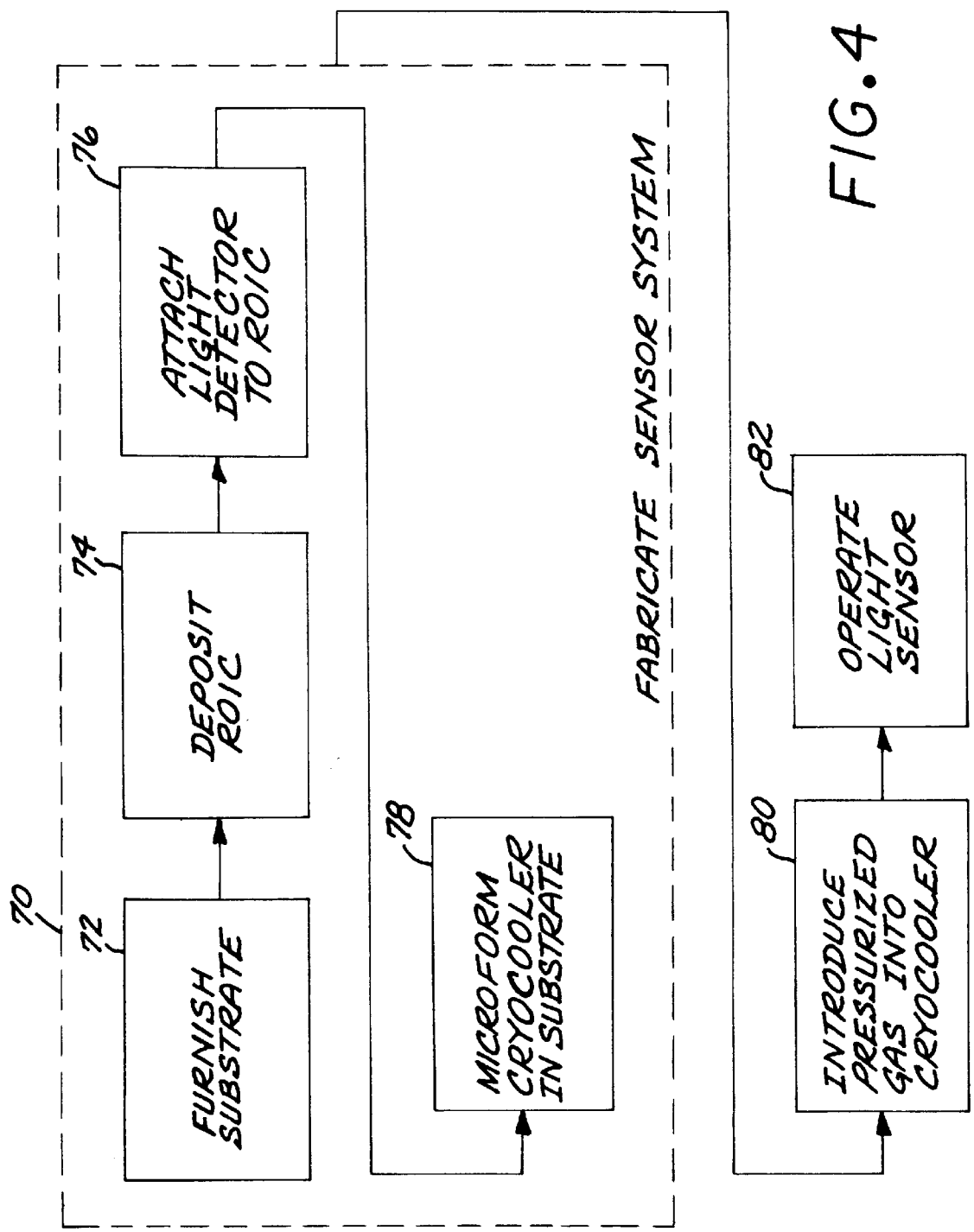
FIG. 4 is a block flow diagram of an approach for practicing the invention.

FIG. 4 illustrates a preferred approach to practicing the invention. The microelectronic system 20, here in the form of the sensor system, is fabricated, numeral 70. In this fabrication 70, the substrate 72 is furnished, numeral 72. The substrate 22 is any operable material. In the preferred multilayer construction of the substrate 22, the second layer 58 is of the material required for the ROIC technology that is to be employed, in this case silicon. The first layer 56 is typically of the same material as the second layer 58 to avoid thermal expansion mismatches, but it may be of a different material.

The microelectronic device 24, here in the form of the readout integrated circuit 26, is deposited in the substrate 22, and specifically the second layer 58 where the substrate 22 is of the layered construction, numeral 74. The light detector 28 is attached to the readout integrated circuit 26 by any operable technique, numeral 76. The preferred approach is using metallic bumps 62 that serve both as electrical and mechanical connections. Techniques for practicing the steps 72, 74, and 76 are known in the art for conventional sensors.

The cryocooler 30 is microformed into the substrate 22 by any operable approach, numeral 78. The cryocooler 30 and its previously described features are preferably micromachined into the substrate by laser micromachining to accomplish the microforming. Laser micromachining is a technique that is known in the art for other applications. In a preferred approach for micromachining silicon, the area to be micromachined is heated with a finely focused laser beam, such as a laser beam from a 15–20 watt gallium arsenide layer. Chlorine gas is passed over the heated area, so that the chlorine combines with the silicon in the heated area to form silicon chloride gas that is removed. Alternatively but less desirably, the cryocooler 30 may be formed into the substrate 22 as the substrate 22 is initially grown or deposited. Where the substrate 22 has the layers 56 and 58, the optional insulation layer 60 is deposited, as by vapor deposition, and the two layers 56 and 58 are affixed together, as by an adhesive such as an epoxy or by brazing. The fabrication of the microelectronic system 20 is complete.

The order of the steps 74/76 and 78 may be altered, or the order of substeps within and between these steps may be altered. For example, the cryocooler 78 may be microformed into the substrate prior to the deposition step 74 and the attachment step 76, or the cryocooler 78 may be partially or completely microformed into the substrate during the furnishing step 72.

During service, a pressurized working gas such as dry air, argon, nitrogen, or krypton is introduced into the inlet end 38 of the gas inflow channel 36, typically at a pressure of from about 6000 to about 8000 pounds per square inch, numeral 80. The working gas expands through the expansion nozzle 42 and cools, typically but not necessarily liquefying. The working fluid absorbs heat and vaporizes, if a liquid. It thereby conducts that heat out of the microelectronic system 20 with the flow of the working gas. When the microelectronic device 24, such as the light sensor, has cooled to a sufficiently low temperature, it is activated and operated, numeral 82.

In the present approach, the cryocooler 30 is positioned as closely as is physically possible to the microelectronic device 24. The microelectronic device 24 is therefore cooled rapidly from room temperature to its operating temperature, typically in 10 seconds or less. This decreased cooldown time from the start of cooldown until the light sensor is ready for operation is an important advantage of the invention. There are no interfaces and a minimal distance between the cryocooler 30 and the microelectronic device 24 to be cooled, resulting in a low thermal impedance of the cooling system.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelectronic system comprising:
   a semiconductor substrate;
   a microelectronic device formed in and integral with the substrate; and
   a cryocooler formed in and integral with the substrate, wherein the cryocooler comprises
      a gas inflow channel in the substrate,
      an expansion nozzle in the substrate and having a nozzle inlet that receives a gas flow from the gas inflow channel, and a nozzle outlet, and
      a gas outflow channel in the substrate that receives the gas flow from the nozzle outlet, wherein the gas inflow channel and the gas outflow channel are each a spiral.

2. The microelectronic system of claim 1, wherein the substrate has a front side and a back side, the microelectronic device is supported on the front side of the substrate, and the cryocooler lies between the front side and the back side of the substrate.

3. The microelectronic system of claim 1, wherein the substrate is made of silicon.

4. The microelectronic system of claim 1, wherein the microelectronic device is a light sensor.

5. The microelectronic system of claim 1, wherein the microelectronic device is a light sensor which comprises:
   a readout integrated circuit formed in and integral with the substrate, and
   a light detector supported on and electrically interconnected with the readout integrated circuit.

6. The microelectronic system of claim 1, wherein the microelectronic device comprises a microcircuit.

7. The microelectronic system of claim 1, wherein the cryocooler is a Joule-Thomson cryocooler.

8. The microelectronic system of claim 1, wherein the gas outflow channel is countercurrent to the gas inflow channel.

9. The microelectronic system of claim 1, further including
   an expansion volume in fluid communication with the nozzle outlet, and wherein the gas outflow channel is in fluid communication with the nozzle outlet through the expansion volume.

10. The microelectronic system of claim 9, wherein the substrate comprises a first layer and a second layer, and wherein the gas inflow channel and gas outflow channel are in the first layer, the expansion volume is in the second layer, and the microelectronic device is integral with the second layer.

11. The microelectronic system of claim 3, wherein the microelectronic device is a silicon-based technology.

12. A microelectronic system comprising:
   a substrate;
   a microelectronic device supported on the substrate, the microelectronic device comprising a microcircuit formed in the substrate; and
   a cryocooler formed in and integral with the substrate, the cryocooler comprising
      a gas inflow channel formed in the substrate, the gas inflow channel having an inlet end and an outlet end,
      an expansion nozzle formed in the substrate and having a nozzle inlet in fluid communication with the outlet end of the gas inflow channel, and a nozzle outlet, and
      a gas outflow channel formed in the substrate and having an inlet end in fluid communication with the nozzle outlet, and an outlet end, and
      an expansion volume in fluid communication with the nozzle outlet, wherein the gas outflow channel is in fluid communication with the nozzle outlet through the expansion volume, wherein the substrate comprises a first layer and a second layer, and wherein the gas inflow channel and gas outflow channel are in the first layer, the expansion volume is in the second layer, and a readout integrated circuit is integral with the second layer.

13. The microelectronic system of claim 12, wherein the substrate is a semiconductor.

14. The microelectronic system of claim 12, wherein there is no interface between the microelectronic device and the cryocooler.

15. A method for cooling a microelectronic system, comprising the steps of
   fabricating a microelectronic system by the steps of
      furnishing a substrate having a front side and a back side,
      depositing a microelectronic device on the front side of the substrate, and
      microforming a cryocooler within the substrate between the front side and the back side of the substrate;
   introducing a pressurized gas into the cryocooler to cool the substrate and the microelectronic device; and
   operating the microelectronic device.

16. The method of claim 15, wherein the microelectronic device comprises a light sensor.

17. The method of claim 15, wherein the step of microforming includes the steps of microforming
   a gas inflow channel in the substrate,
   an expansion nozzle in the substrate and having a nozzle inlet that receives a gas flow from the gas inflow channel, and a nozzle outlet, and
   a gas outflow channel in the substrate that receives the gas flow from the nozzle outlet.

18. The method of claim 17, wherein the step of microforming includes the step of microforming
   an expansion volume in fluid communication with the nozzle outlet, and wherein
      the gas outflow channel is in fluid communication with the nozzle outlet through the expansion volume.

19. The method of claim 15, wherein the substrate has a first layer and a second layer, and wherein the step of microforming includes the step of
   microforming the gas inflow channel and gas outflow channel in the first layer and the expansion volume in the second layer, and
wherein the step of depositing a microelectronic device includes the step of
   depositing a readout integrated circuit in the second layer.

20. The method of claim 15, wherein the step of microforming includes the step of
   laser micromachining the cryocooler within the substrate.

21. The method of claim 15, wherein the step of furnishing the substrate includes the step of
   furnishing a semiconductor substrate.

22. A microelectronic system comprising:
   a silicon substrate comprising a first layer and a second layer;
   a silicon-based readout integrated circuit integral with and formed in the second layer of the silicon substrate; and
   a cryocooler formed in and integral with the silicon substrate, wherein the cryocooler comprises
      a gas inflow channel in the first layer of the silicon substrate,
      an expansion nozzle in the silicon substrate and having a nozzle inlet that receives a gas flow from the gas inflow channel, and a nozzle outlet,
      a gas outflow channel in the first layer of the silicon substrate that receives the gas flow from the nozzle outlet, and
      an expansion volume in the second layer of the silicon substrate and in fluid communication with the nozzle outlet, and wherein the gas outflow channel is in fluid communication with the nozzle outlet through the expansion volume,
wherein therein there is no interface between the microelectronic device and the cryocooler.

* * * * *